United States Patent [19]
Chiarulli et al.

[11] Patent Number: 4,883,334
[45] Date of Patent: Nov. 28, 1989

[54] OPTICAL SELECTOR SWITCH

[75] Inventors: Donald M. Chiarulli; Rami Melhem; Steven P. Levitan, all of Pittsburgh, Pa.

[73] Assignee: The University of Pittsburgh, Pittsburgh, Pa.

[21] Appl. No.: 126,931

[22] Filed: Nov. 30, 1987

[51] Int. Cl.$^4$ .............................................. G02B 6/10
[52] U.S. Cl. .................. 350/96.13; 350/96.16
[58] Field of Search ............ 350/96.13, 96.15, 96.16, 350/96.20, 96.29; 455/610, 612, 608, 618

[56] References Cited
U.S. PATENT DOCUMENTS
4,742,576  5/1988  McMahon ..................... 455/612 X Primary Examiner—Frank Gonzalez
Assistant Examiner—John Ngo
Attorney, Agent, or Firm—Reed Smith Shaw & McClay

[57] ABSTRACT

The present invention pertains to an optical selector switch. The optical selector switch includes an optical waveguide means, and M means for producing light that can be transmitted through the optical waveguide means with M being greater than or equal to 2. The M light producing means are optically connected to the optical waveguide means. The optical selector switch includes means for controlling when each of the M light producing means produces optical pulses to be transmitted through the optical waveguide means. Additionally, there are N optical transduces optically connected to the optical waveguide means, with N being greater than or equal to 2. Each of the N optical transducers are capable of producing an electrical signal corresponding to the combination of optical pulses received from the M light-producing means. The N optical transducers can be arranged in either a one, two or three dimensional array. Moreover, memory cells can be included to provide for a memory array.

31 Claims, 6 Drawing Sheets

OPTICAL SELECTOR SWITCH

FIELD OF THE INVENTION

The present invention relates to optical selector switches. More specifically, the present invention relates to optical selector switches utilizing optical pulses which propagate in opposite directions through an array of optical transducers to coincide at and thus access specific optical transducers in the array.

BACKGROUND OF THE INVENTION

Figure 1:
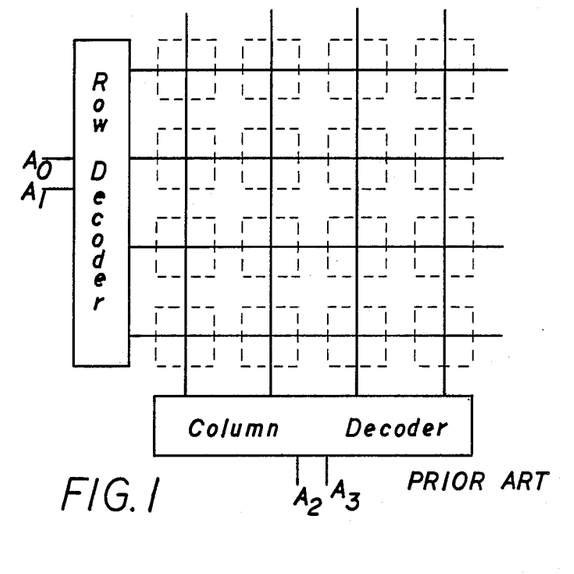
FIG. 1 is a schematic drawing of a prior art memory array.

In a conventional electronic memory circuit, like the one shown in FIG. 1, an incoming memory address is divided into row and column addresses, each decoded separately. The selected memory location is the intersection of the select lines generated by the row and column decoders. In common bus multiprocessors these decoders have traditionally been a performance limiting bottleneck. Each decoder can process only a single encoded address, thus limiting memory access to a single location. Memory interleaving techniques, which subdivide the memory space into regions, each in a separate memory unit, see Chen, T.C., "Overlap and Pipeline Processing", in *Introduction to Computer Architecture*, ed. Harold Stone, Science Research Associates, 1975, are commonly applied in an attempt to make parallel some subset of memory accesses. More recently, sophisticated cache memory systems, see Briggs, F. and K. Hwang, *Computer Architecture and Parallel Processing*, McGraw Hill, 1984, have been developed which physically reproduce portions of shared memories in a local store. Both systems have obvious limitations. Interleaved systems impose an ordering in which parallel accesses to a shared memory may be made, and cache memories rely on the locality of memory references for each processor and require a large overhead to support cache coherence.

The present invention overcomes these limitations by using the high bandwidth of optics to time multiplex fully decoded addresses into an optical "select" pulse train. Using a technique based on the coincidence of optical pulses the optical select pulse train can be directly applied to a memory array to address one or more memory cells. Effective parallelism is possible in this technique because of the differential between optical and electronic bandwidth. Within a single electronic memory access cycle, N parallel memory references are possible where N is limited only by the ratio of optical to electronic bandwidths.

The addressing mechanism, which is called "optical pulse delay modulation", is based on the use of time delays between optical pulses. The optical pulses are propagated through waveguides in several directions through the memory array. By appropriately adjusting the delays, these pulses can be made to coincide at specific memory cells. This coincidence is detected by photodetectors at the addressed locations, thereby selecting those locations for memory access.

SUMMARY OF THE INVENTION

The present invention pertains to an optical selector switch. The optical selector switch comprises an optical waveguide means, and M means for producing light that can be transmitted through the optical waveguide means with M being greater than or equal to 2. The M light producing means are optically connected to the optical waveguide means. The optical selector switch includes means for controlling when each of the M light producing means produces optical pulses to be transmitted through the optical waveguide means. Additionally, there are N optical transducers optically connected to the optical waveguide means, with N being greater than or equal to 2. Each of the N optical transducers are capable of producing an electrical signal corresponding to the combination of optical pulses received from the M light-producing means. The N optical transducers can be arranged in either a one, two or three dimensional array. Moreover, memory cells can be included to provide for a memory array.

BRIEF DESCRIPTION OF THE DRAWINGS

A more complete appreciation of the present invention and many of the attendant advantages thereof will be readily obtained as the same becomes better understood by reference to the following detailed description when evidenced in connection with the accompanying drawings wherein.

DESCRIPTION OF THE PREFERRED EMBODIMENT

Figure 2:
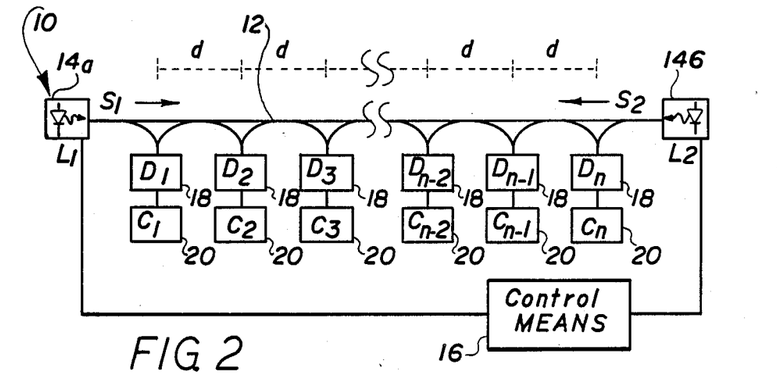
FIG. 2 is a schematic drawing of a linear array optical selector switch.

Referring now to the drawings, wherein like reference numerals designate identical or corresponding parts throughout the several views, there is shown in FIG. 2 an optical selector switch 10. The optical selector switch 10 comprises an optical waveguide means 12, and M means 14 for producing light that can be transmitted through the optical waveguide means 12, with M being greater than or equal to 2. The M light producing means 14 are optically connected to the optical waveguide means 12. The optical selector switch 16 includes means 16 for controlling when each of the M light producing means 14 produces optical pulses to be transmitted through the optical waveguide means 12. Additionally, there are N optical transducers 18 optically connected to the optical waveguide means 12, with N being greater than or equal to 2. Each of the N optical transducers 18 are capable of producing an electrical signal corresponding to the combination of optical pulses received from the M light-producing means 14.

In the embodiment of the invention shown in FIG. 2 the N optical transducers 18 are disposed in serial along the optical waveguide means 12 forming a linear array.

Each of the N optical transducers 18 are situated at a predetermined position from each of the M light producing means 14. Preferably, there is only a first light producing means 14a and a second light producing means 14b and each of the N optical transducers are a distance d apart. The distance d is defined as $d = \tau C_g$, where $\tau$ is the band-width of the pulse and $C_g$ is the speed of the light produced from the first and second light producing means 14a, 14b in the optical waveguide means 12. The first and second light producing means 14a, 14b are optically connected to the optical waveguide means 12 such that the optical pulses from the first light producing means 14a and the optical pulses from the second light producing means 14b are transmitted in opposite directions through the optical waveguide means 12. The controlling means 16, for instance a clocking circuit, determines when the first and second light producing means 14a, 14b produce optical pulses, as is well known in the art.

The optical transducer 18 produces an electrical signal when a wavefront of a light pulse from the first and second light producing means 14a, 14b is received at essentially the same time by the optical transducer 18. Preferably, the optical transducer produces an electrical signal when a wavefront of a dark pulse from the first and second light producing means 14a, 14b is received at essentially the same time by the optical transducer 18. The optical transducer can include an optical OR gate which produces an electrical signal corresponding to logic zero when the wavefront of a dark pulse from the first and second light producing means 14a, 14b is received at essentially the same time by the optical transducer 18.

Preferably, the first and second light producing means 14a, 14b are first and second laser diodes 14a, 14b and the optical waveguide means 12 includes an optical fiber 12 optically connected to the first and second laser diodes 14a, 14b and to the N optical transducers 18. The optical OR gate includes a photodetector that is optically connected to the optical fiber 12.

One application of many possible applications for the optical selector switch 10 is for it to be used for instance in a memory module in which it can further include a synchronation signal for controlling the transmission of data from the selected memory location. When the optical selector switch 10 is used for a memory module then the optical selector switch 10 includes N memory cells 20 for storing a memory signal, otherwise known as data. The N memory cells are disposed such that each one of the N memory cells 20 is electrically connected to each one of the N photodetectors of the N optical transducers and receives the electrical signal therefrom. Each of the N memory 20 cells produces its memory signal when an electrical signal is received from the photodetector with which it is electrically connected.

Figure 3:
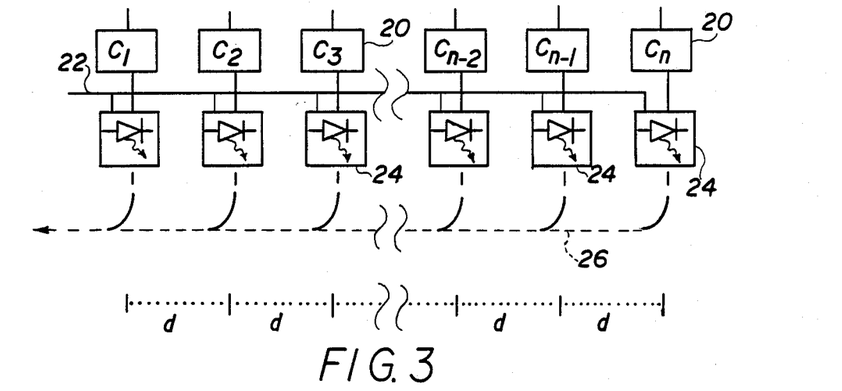
FIG. 3 is a schematic drawing of a data output portion of an optical selector switch.

The optical selector switch 10, being used as a memory module, can further include a synchronation signal line 22 for transmitting a synchronation signal. Additionally, there is included N data laser diodes 24 are disposed such that each one of the N data laser diodes is electrically connected to the synchronation signal line 22 and to each one of the N memory cells 20 in order to receive the memory signal therefrom as shown in FIG. 3. Each of the N data laser diodes 24 produces an optical signal corresponding to the synchronation signal and the memory signal it receives from the synchronation signal line 22 and the photodetector, respectively. Preferably, each of the N data laser diodes produce their respective optical signal at essentially the same time. This is accomplished by the signal from the synchronation signal line 22 arriving at each of the N data laser diodes 24 at essentially the same time and triggering them. Also in the optical selector switch 10 there is included a data output optical fiber 26 optically connected to each of the N data laser diodes 24. Each of the N data laser diodes are preferably a distance d apart and are essentially the same optical distance from the data output optical fiber.

In the operation of the previously described embodiment, as shown in FIG. 2, an optical selector switch 10 which is being used as a memory module is composed of N memory cells each storing one bit of data. A trigger or select signal for each memory cell is an electronic signal at the output of a photodetector which is electrically connected to the memory cell. The photodetector generates the logical OR of two incident optical signals, denoted in FIG. 2 by $s_1$ and $s_2$.

The signals $s_1$ and $s_2$ travel in opposite directions along an optical path of an optical waveguide means 12, which can be either an optical fiber or a planar waveguide in an integrated optical device, see Lee, D. L., *Electromagnetic Principles of Integrated Optics*, John Wiley and Sons, New York, 1986. Photodetectors are placed at fixed distance intervals $\kappa d$ along the optical path, where $\kappa \geq 1$, and a first and a second laser diode. 14a, and 14b, are coupled to each end. Both laser diodes 14a 14b are normally on and the photodetectors normally generate a logic one electrical signal. Two dark pulses of duration $\tau$ are transmitted, one from the first laser diode 14a and the other from the second laser diode 14b at times $t_1$ and $t_2$, respectively. These pulses represent dark spots propagating at speed $c_g$ (the speed of light in the waveguide). By carefully selecting the delay between $t_1$ and $t_2$ the two dark spots can be made to meet at exactly one photodetector. This photodetector then turns off, generating a logic zero of duration $\tau$. The distance d between any two photodetectors is chosen to be equal to $d = \tau c_g$, the propagation distance corresponding to the pulse duty cycle. The delay $t_1-t_2$ is also chosen such that it is an even multiple of d. More specifically, if $$t_1 - t_2 = (N-1-2(k-1))\tau \tag{1}$$

then, the two dark spots meet at the $k^{th}$ photodetector of the N photodetectors, thus addressing the $k^{th}$ memory cell of the N memory cells For example, when N=5, if the second laser diode 14b generates its dark pulse $2\tau$ seconds before the first laser diode generates its pulse, then (1) gives k=2, that is the two pulses meet at the second of five photodetectors. Similarly, if the second laser diode generates its pulse $2\tau$ seconds after the first laser diode generates its pulse, then the two pulses meet at the fourth of five photodetectors. The middle memory cell is chosen by generating the two pulses simultaneously, that is having $t_1 = t_2$. Therefore, the address of the memorY cell is encoded using the delay $t_1-t_2$. In this embodiment, the pulse generated by the first laser diode is treated as the reference pulse and the pulse generated by the second laser diode becomes a select pulse. In the remaining discussion, the terms $t_{ref}$ and $t_{sel}$ will refer to $t_1$ and $t_2$, respectively.

The memory access time of the memory module is determined by the maximum delay needed to address any cell in the array. From (1), it is clear that for k=1, ...,N, $$-(N-1)\tau < t_{ref} + t_{sel} < (N-1)\tau \qquad (2a)$$

from which the memory access time, $\sigma$, is given by $$\sigma = 2N\tau \qquad (2b)$$

Note that equation (2a) indicates that the select pulse occurs within $N\tau$ before or after the reference pulse.

The parallelism in this addressing scheme comes from the fact that within time $\sigma$, it is possible to address more than one memory cell by sending a series of pulses from the second laser diode 14b, one for each memory reference. Each of these pulses intersects with the reference pulse at the desired photodetector. In other words, parallel memory references are positionally distinguishable in a pulse train generated by a series of select pulses.

In order for the memory signal or data stored in the memory cells 20 to be read by a processor (not shown) when it has issued a read request for the data in the $k^{th}$ position of the N memory cells, a read data pulse train is provided by the optical selector switch 10. One method for generating the read data pulse train is to use a structure similar to the one depicted in FIG. 3. In this structure, N data laser diodes 24 separated by an optical distance d are optically connected to a data output optical fiber 26. When a specific memory location k is addressed, an electronic signal is generated from the $k^{th}$ photodetector as described above. The data at location k is assumed to be stored electronically and is used to modulate the $k^{th}$ laser diode only if location k is addressed. A synchronization signal, sync 2, delivered by synchronization signal line 22 is used to synchronize the output of light (positive) pulses of duration $\tau$ from the selected memory cells 20 which store a one value. The difference in the optical path lengths between the laser diodes ensures the correct generation of the data pulse train. A similar technique can be used to demultiplex the pulse trains by using detectors at fixed distances d, and latching the pulse train at each processor interface.

In an alternative embodiment for providing optical pulses to the N optical transducers 18, the first and second light producing means 14a, 14b are optically connected to the optical waveguide means 12 such that the respective optical pulses are transmitted in the same direction through the optical waveguide means 12, the first light producing means 14a produces optical pulses that are transmitted through the optical waveguide means 12 at a different speed than the speed at which the optical pulses produced by the second light producing means 14b are transmitted through the optical waveguide means 12. Each of the N optical transducers 18 are a distance d apart. Here $d = \tau Cg$, where $\tau$ is the band-width of the optical pulse and Cg is the speed of the light in the optical waveguide means 12 of the first light producing means 14a. The band-width and the speed of the light in the optical waveguide means of the optical pulses from the first light producing means is longer and slower, respectively, than the band-width and the speed of the light in the optical waveguide means of the optical pulses from the second light producing means 14b. Because the speed of the optical pulses are different, the first and second light producing means 14a, 14b can be triggered such that the optical pulse from the second light producing means 14b overtakes the optical pulse from the first light producing means at a desired optical transducer, thus triggering it.

In other alternative embodiments of the optical selector switch, the N optical transducers 18 are arranged in a 2-dimensional 26 or 3-dimensional array 28. The N optical transducers can be arranged in preferably, an $\sqrt{N}$ rows $30 \times \sqrt{N}$ columns 32 array 26. Preferably, there is a first, second and third light producing means 14a, 14b or 14c respectively Each of the N optical transducers 18 are a distance $\kappa d$ apart, where $d = \tau Cg$ and where $\tau$ is the band-width of the pulse and Cg is the speed of the light in the optical waveguide means 12 produced from the first, second and third light producing means 14a, 14b, 14c and where $\kappa \leq 1$. The first and second light producing means 14a, 14b are optically connected to the optical waveguide means 12 such that the optical pulses from the first light producing means 14a and the optical pulses from the second light producing means 14b are transmitted in opposite directions through the optical waveguide means 12 along the $\sqrt{N}$ rows 30. The third light producing means 14c is optically connected to the optical waveguide means 12 such that the optical pulses from the third light producing means 14c are transmitted through the optical waveguide means 12 along the $\sqrt{N}$ columns 32. Preferably, an optical pulse from the first light producing means 14a is transmitted along each of the $\sqrt{N}$ rows 30 and is received by the $\sqrt{N}$ transducers 18 of any given column 32 at essentially the same time. An optical pulse from the second light producing means 14b is transmitted along each of the $\sqrt{N}$ rows 30 and is received by the $\sqrt{N}$ optical transducers 18 of any given column 32 at essentially the same time. Additionally, an optical pulse from the third light producing means 14c is transmitted along each of the N columns 32 and is received by the $\sqrt{N}$ optical transducers 18 of any given row 30 at essentially the same time.

An optical transducer 18 produces, for example, an electrical signal when a wavefront of a light pulse from each of the first, second and third light producing means 14a, 14b, 14c is received at essentially the same time by the optical transducer 18. Preferably, an optical transducer 18 produces an electrical signal when a wavefront of a dark pulse from each of the first, second and third light producing means 14a, 14b, 14c is received at essentially the same time by the optical transducer 18.

The optical transducer 18 can include, for instance, an optical OR gate which produces an electrical signal corresponding to logic zero when the wavefront of a dark pulse from each of the first, second and third light producing means 14a, 14b, 14c is received at essentially the same time by the optical transducer 18. The optical OR gate includes a photodetector optically connected to the optical waveguide means 12 which converts the optical pulse to an electrical signal.

The optical selector switch 10 in the form of a 2-dimensional array 26 can be used in many different applications. One application of many possible applications for the optical selector switch 10 is for it to be used in a memory module. When the optical selector switch is to be used as a memory module the optical selector switch includes $\sqrt{N}$ priority chain optical fibers 34 for transmitting light. Each one of the, $\sqrt{N}$ priority chain optical fibers 34 are optically connected to each of the $\sqrt{N}$ optical transducers 18 in each one of the $\sqrt{N}$ rows 30, respectively, There is also included a synchronation signal line 36 for transmitting a synchronation signal. The synchronation signal line 36 is electrically connected to each of the N optical transducers 18. Additionally, the optical transducer 18 includes a NOR gate 38 electrically connected to the photodetector 23, and a chain receive photodetector 40 optically connected to the respective priority chain optical fiber 34 which receives light therefrom and produces a chain receive electrical signal corresponding thereto. The chain receive photodetector 40 is electrically connected to the NOR gate 38 such that when the chain receive electrical signal is produced it is received by the NOR gate 38. The optical transducer 18 also includes a chain send laser diode 42 electrically connected to the photodetector 23 and optically connected to the respective priority chain optical fiber 40 such that when an electrical signal is produced by the photodetector 23 the chain send laser diode 42 produces light that is transmitted through the priority chain optical fiber 40. There is a memory 44 having a memory signal electrically connected to the NOR gate 38. Moreover, there is a data output laser diode 46 electrically connected to the NOR gate 38 and the synchronation signal line 36, such that the data output laser diode 46 produces a signal corresponding to the signal produced by the NOR gate 38 when it receives a synchronation signal.

In order to transfer the memory signal or data to a processor (not shown) the optical selector switch 40 includes $\sqrt{N}$ data output optical fibers 48 optically connected to the data output laser diode 46 of the $\sqrt{N}$ optical transducers 18 in the $\sqrt{N}$ columns 32, respectively. The optical transducer 18 preferably also includes a select latch 50 electrically connected to the photodetector 23. The select latch 50 produces a latched electrical signal corresponding to the electrical signal produced by the photodetector 23. The select latch 50 is also electrically connected to the NOR gate 38 and the priority chain send laser diode and provides the latch electrical signal thereto.

The optical waveguide means 12 preferably includes 2 $\sqrt{N}$ fibers 52; 1 through $\sqrt{N}$ of the 2 $\sqrt{N}$ optical fibers are optically connected to the photodetectors 23 of each of the $\sqrt{N}$ optical transducers 18 of the $\sqrt{N}$ rows 30, respectively, and also optically connected to the first and second laser diodes 14a, 14b. $\sqrt{N}+1$ through 2 $\sqrt{N}$ of the 2 $\sqrt{N}$ optical fibers 52 are optically connected to the photodetectors 23 of each of the $\sqrt{N}$ optical transducers 18 of the $\sqrt{N}$ columns 32, and also optically connected to the third laser diode 14c.

Figure 4:
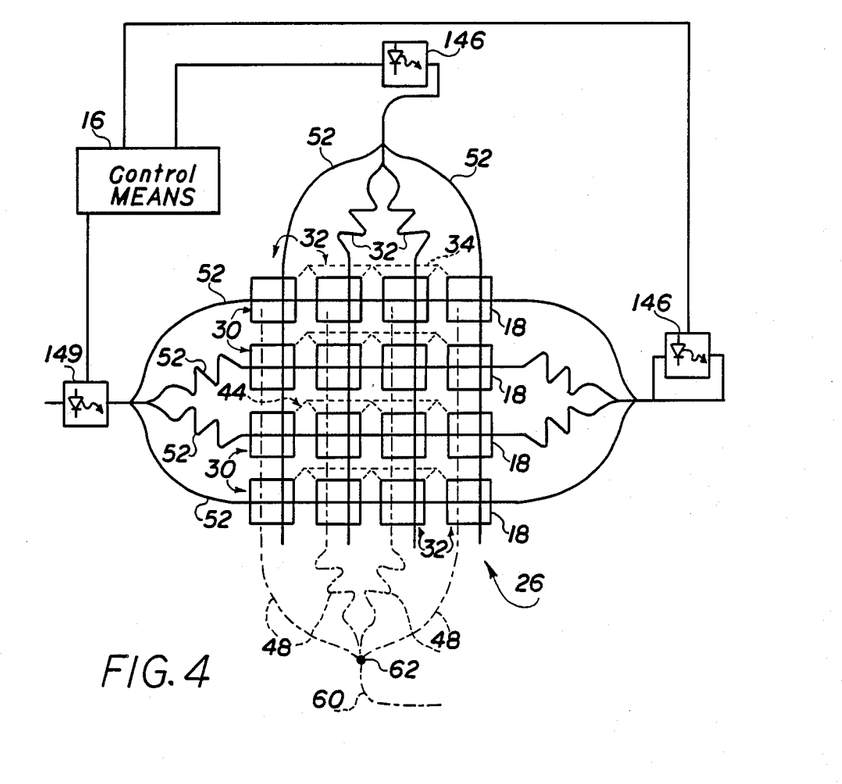
FIG. 4 is a schematic drawing of a 3-dimensional array optical selector switch.

The optical selector switch 10 used in a memory module, in order to have write capabilities, has only N/2 memories 44. The N optical transducers 18 are arranged in a first and second $\sqrt{N/2}$ rows 30×$\sqrt{N/2}$ columns 32 array 26a and 26b, as shown in FIG. 4 where N=8. The first and second arrays 26a, 26b are aligned such that each optical transducer 18 in the first array 26a is electrically connected to memory 44 of the $\sqrt{N/2}$ memories 44 and has an associated optical transducer 18 in the second array 26b also connected to the respective 1 memory 44 of the N/2 memories 44. Each memory 44 has a memory signal corresponding to the electrical signals received from the optical transducers 18 to which it is electrically connected. The use of two optical transducers 18 allows for the control of read or write, for instance by the proper electrical signal from one of the optical transducers 18; and what to write, for instance from the electrical signal of the other associates optical transducer 18.

Figure 9:
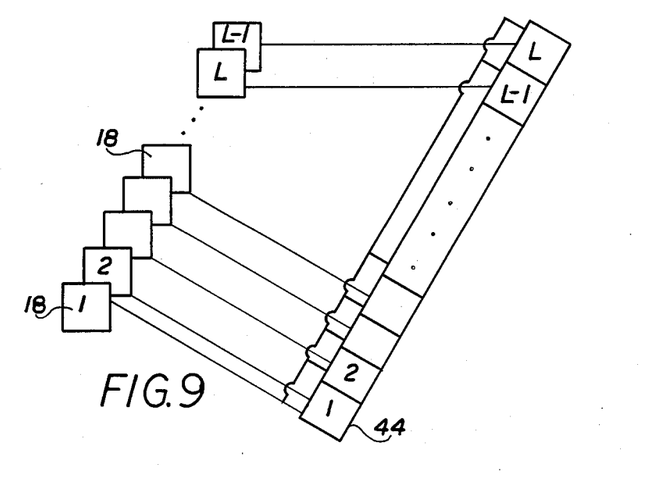
FIG. 9 is a schematic representation of a portion of an optical selector switch with write capability comprising L+1 associated optical transducers and an associated memory having a length of L bits.

An alternative embodiment of the memory module that includes write capability has $$\sqrt{\frac{N}{L+1}}$$

memories. The N optical transducers 18 are arranged in $$L+1\sqrt{\frac{N}{L+1}} \text{ rows } x\sqrt{\frac{N}{L+1}} \text{ columns } 30$$

arrays. Each memory 44 is electrically connected to one of the $$\sqrt{\frac{N}{L+1}}$$

optical transducers 18 in each array. Each memory 44 has a memory signal corresponding to the electrical signals received from the optical transducers 18 to which it is electrically connected. FIG. 9 schematically shows a memory 44 of L bit length and each optical transducer 18 to which it is electrically connected. This embodiment is useful when it is desired to write L bits at essentially the same time into an L bit length memory 44.

Figure 5:
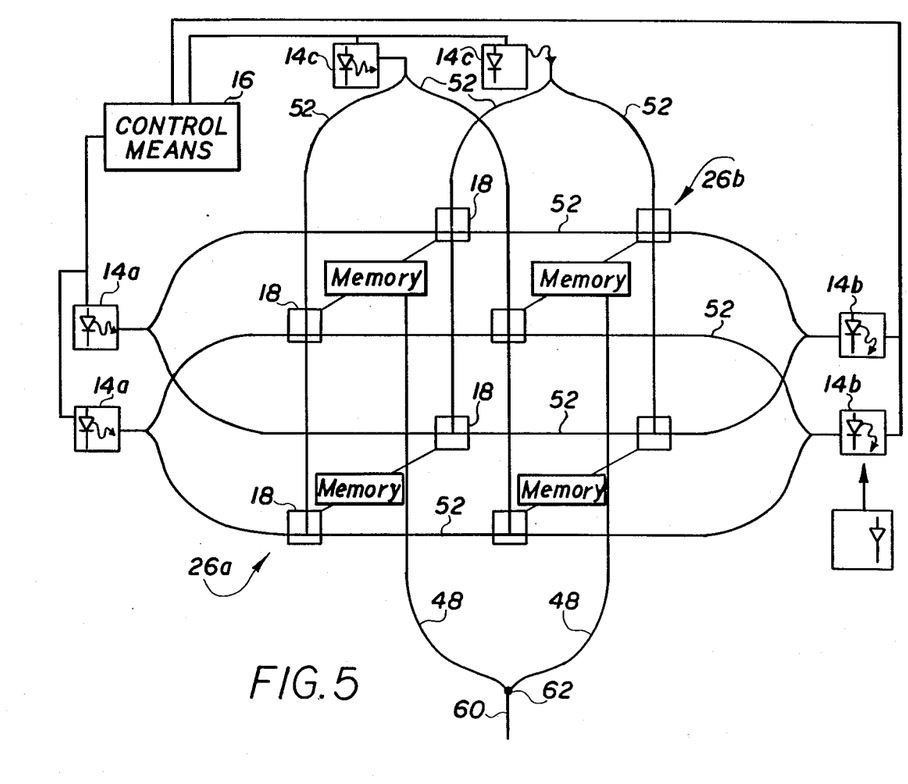
FIG. 5 is a schematic drawing of a 2-dimensional array optical selector switch.

In the operation of the preferred embodiment, a 2 dimensional array 26 of size N, as shown in FIG. 5, is composed of $\sqrt{N}$ rows 30×$\sqrt{N}$ columns 32 array of optical transducers 18, separated by a distance $d=\tau c_g$ in both the vertical and the horizontal directions. The optical transducer 18 utilizes a photodetector 23 which generates the logical OR of three optical signals that are inputted thereto. Specifically, these inputs are based upon a pulse reference dark wavefront generated by the first laser diode 14a, a select pulse train generated from the second laser diode 14a, both traveling horizontally along the rows 30 through the array 26 in opposite directions, and a select pulse train generated by the third laser diode, traveling vertically.

The optical 14c pulse generated by the first and second laser diodes 14a, 14b is provided to $\sqrt{N}$ parallel optical fibers 52 that extend through the 2-dimensional array 26 along the rows 30 thereof. The optical pulse from the first and second laser diodes 14a, 14b is broken into $\sqrt{N}$ signals that travel along the $\sqrt{N}$ parallel optical fibers 52 to the photodetector of each optical transducer 18 in a row 30. Similarly, the optical pulse generated by the third laser diode 14c is provided to the $\sqrt{N}$ parallel optical fibers 52 that extend through the 2-dimensional array 26 along the columns 32 thereof. The optical pulse from the third laser diode 146 is broken into $\sqrt{N}$ parallel optical fibers 52 to the photodetector of each optical transducer 18 in a column 32. Since the optical path length of all the optical fibers 52 are equal, the Wavefront of a dark pulse arrives at all optical transducers in a single row (or column) simultaneously. For example, an optical pulse generated by the first laser diode 14a and directed horizontally along the rows 30 through the array 26 is simultaneously incident at all the optical transducers 18 in a given column 32. Similarly, any pulse generated by the third laser diode 14c arrives at all the optical transducers 18 in a specific row 30, simultaneously.

In order to derive the equations that govern the intersections of three wavefronts of optical pulses, assume, as in the case of the linear array 21, that all three laser diodes are on and that the first laser diode 14a generates a dark pulse of duration $\tau$ at time $t_{ref}$. Also the second laser diode 14*b* and the third laser diode 14*c* generate dark pulses at times $t_{col}$ and $t_{row}$, respectively. If the timing of the second laser diode 14*b* is such that $$t_{ref} - t_{col} = (\sqrt{N} - 1 - 2(j - 1))\tau \qquad (3)$$

then the two dark wavefronts generated by the first laser diode 14*a* and the second laser diode 14*b* meet at the $i^{th}$ column of the N columns 32 of the array 26. In order to select a particular optical transducer 18 in that column 32, the third dark wavefront, namely the one generated by the third laser diode 14*c*, should be crossing the $i^{th}$ row 30 of the N rows 30 of the array 26 when the other two wavefronts meet at column j. This may be accomplished by timing the third laser diode 14*c* such that $$t_{ref} - t_{row} = (-i)\tau \qquad (4)$$

In other words, to address a certain memory location i,j, in the N optical transducers 18 of the array 26 the column 32 number j is encoded as $t_{ref}$-$t_{col}$ and the difference, j-i between the column number and the row number is encoded as $t_{ref}$-$t_{row}$. From (3) and (4) it may be shown that $$-(\sqrt{N} - 1)\tau < t_{ref} - t_{col} < (\sqrt{N} - 1)\tau$$

and $$-(\sqrt{N} - 1)\tau < t_{ref} - t_{row} < (\sqrt{N} - 1)\tau$$

and hence, the memory access time, $\sigma$, is $$\sigma = 2\sqrt{N}\,\tau \qquad (5)$$

As in the case of the linear array 21, parallel accesses are possible by generating multiple pulses in the row 30 and column 32 select signals. For example, FIG. 5(*a*) shows the pulse trains for the selection of memory locations of optical transducers (2,2), (1,4) and (4,4) in the 16 location memory array of FIG. 5(*b*) (the first number in the parenthesis identifies the row, and the second number identifies the column). For these three locations, $t_{ref}$-$t_{col}$ should be equal to $-1$, 3 and 3, respectively, and $t_{ref}$-$t_{row}$ should be equal to 0, 3 and 0, respectively. The optical transducers 18 accessed by the wavefront resulting from these pulse trains having dark pulses at times 0, 5 $\tau$ and 7 $\tau$ are shown in FIGS. 5*b*, 15*c* and 5*d* respectively. From FIGS. 5*a*, 5*b* and 5*c*, it is clear from the intersection of the dark pulse wave fronts that location (2,2) is selected at time 5 $\tau$, and locations (1,4) and (4,4) are selected at time 7 $\tau$.

Using the above scheme, it is possible to encode the addresses of all of the N optical transducers 18 in the column 32 and row 30 pulse trains during a single memory access cycle. Preferably, the maximum length of the reference pulse train is chosen to be 2 $\sqrt{N}$, the length of the select pulse trains.

The same data collection structure described in the linear array 21 can be used to collect data from each column 32 of the two-dimensional array 26. One data output optical fiber 48 is dedicated to the collection of the contents of the addressed optical transducers 18 in each column 32. The optical pulses in the $\sqrt{N}$ data output optical fibers 48 are merged into a single data optical fiber collection 60, as is well known in the art, which returns the data to the processors (not shown). The lengths of the data output optical fibers 48 are adjusted such that the optical paths between any of the optical transducers 18 in the same row 30, and the merging point 62 are equal.

With this data collection mechanism, the content of any referenced memory location i, j in column 32 j appears in the $(\sqrt{N}-i+1)^{th}$ time slot on the data output optical fiber 48 of column 32 j. However, when the $\sqrt{N}$ pulse trains corresponding to the $\sqrt{N}$ columns are merged in the data collection optical fiber 60, the optical pulses representative of data produced by any optical transducers 18 in the same row 30 and different columns 32 collide.

To prevent contention between conflicting requests, a priority system based on an optical priority chain is chosen such as the one shown in FIG. 6. FIG. 6 shows a single row of a two-dimensional array 26. The optical distance from each optical transducer 18 in this row 30 to the data collection optical fiber 60 is equal and hence any parallel accesses within this row 30 conflict. In order to avoid this conflict, only one of the optical transducers 18 along this row 30 may be allowed to generate data. In FIG. 6*a*, the horizontal priority chain optical fiber 34 connecting all optical transducers 18 in the row 30 forms an optical priority chain to resolve these conflicts.

Figure 6A:
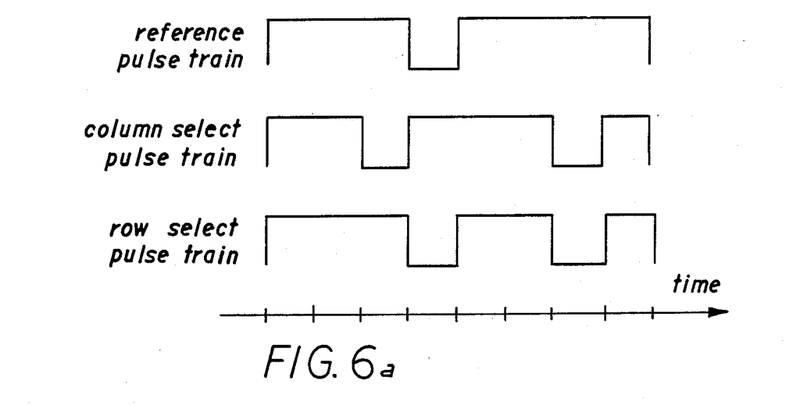
FIG. 6a, 6b and 6c depict the references of wavefronts of optical pulses as they pass through a 2-dimensional array and access desired optical transducers thereof.
Figure 6B:
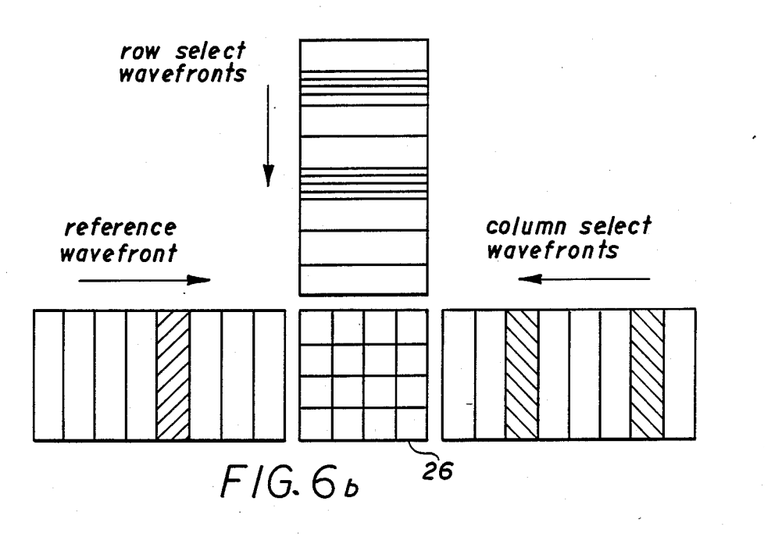
Figure 6C:
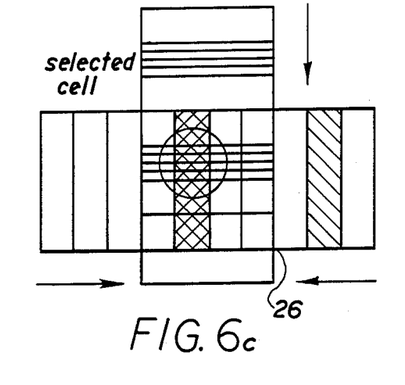
Figure 6D:
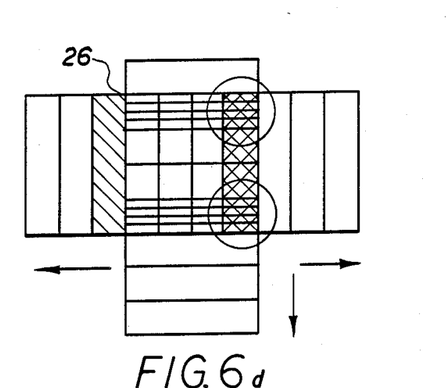
Figure 7A:
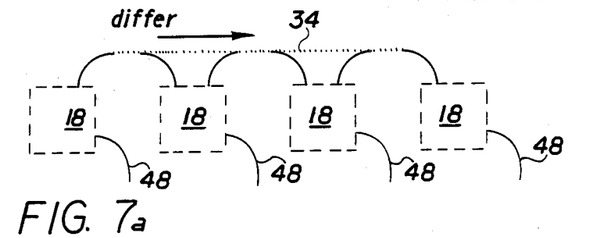
FIGS. 7a and 7b are schematic drawings of portions of the optical selector switch.
Figure 7B:
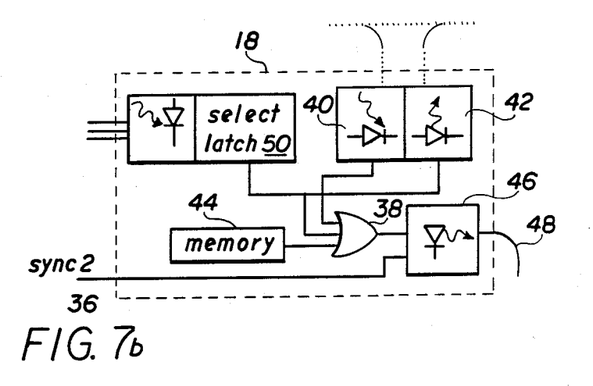

FIG. 6*b* shows a diagram of an embodiment of an optical transducer 18 used in a memory module. The optical OR output from the pulse sensing photodetector sets the select latch 50. This output gates the contents of the memory 44 through the three input electronic NOR gate 38. The third input to this NOR gate is the priority control. This priority control signal is the output of a chain receive photodetector 40 which senses select signals from higher priority optical transducers 10 indicated optically on the priority chain optical fiber 34. The laser diode 92, which injects light into the priority chain optical fiber 34 to indicate its selection to lower priority optical transducers 18. Finally, the synchronization signal, sync 2, ensures that all data output laser diodes 46 in each optical transducer 18 of the array 26 are activated simultaneously.

It should be noted that the above described data contention avoidance scheme follows from the fact that $\sqrt{N}$ data output optical fibers 48 are used to gather the memory signals from the memories 44. In the simplest embodiment each optical transducer 18 has a data output optical fiber 48 optically connected toit to provide transmission of the memory signal therefrom to the processor (not shown). In such a instance, any data contention is dealt with in other ways.

From the above description, it is clear that every memory read cycle is divided into three stages. In the first stage, the select pulse trains are generated and propagated through the 2-diomensional array 26. The minimum time required to complete this stage is equal to $2\sqrt{N}\tau$.

In the second stage, the read operation is propagated through the optical transducer 18. Note that in FIG. 5, the priority chain optical fibers 34 are parallel to the optical fibers 52. In this arrangement, the wavefront of an optical pulse which encodes priorities propagates through the priority chain optical fibers 34 during the first stage of the memory read cycle. The priority is delayed relative to the reference pulse by time $$t_{pd} = t_s + t_1,$$

where $t_s$ is the switching delay of the optical transducer due to the NOR gate, the select latch, etc. and $t_1$ is the turn on time for the chain send laser diode 42. At each optical transducer 18 in the rightmost column of FIG. 5, which are the last optical transducers 18 to see the reference pulse and thus the lowest in the priority chain, the priority input signal arrives at the NOR gate 38 at time $t_{pd} = t_d$ relative to the arrival of the reference pulse. ($t_d$ is the response time of the chain receive photodetector 40.) Since the select signal arrives at the NOR gate 38 in time $t_s$, the critical timing path for the second stage of the memory read cycle is $$t_{pd} + t_d + t_g,$$

where $t_g$ is the NOR gate 38 switching time. By noting that $t_1$ and $t_d$ must be less than or equal to the pulse width $\tau$, the lower bound that can be placed on the second stage delay is $$t_s + t_g + \tau$$

Finally, in the third stage of the memory read cycle, data is returned from the optical transducers 18 to the requesting processors in a pulse train of N bits. Thus, the minimum time required for the third stage is $\sqrt{N}\tau$. Assuming that the memory size and the ratio of electronic to optical bandwidths is sufficient to satisfy.

$$t_s + t_g < (2\sqrt{N} - 1)\tau,$$

the longest of the stages is the first. Using such a three stage memory read cycle the total memory cycle length is then $6\sqrt{\tau}$. Since each stage can process $\sqrt{N}$ references, the effective memory bandwidth limit is $1/(2\tau)$ words/second.

Finally, it should be mentioned that it is possible to support $2\sqrt{N}$ memory references per cycle, rather than merely $\sqrt{N}$, rearranging the data output, optical fibers 48 of FIG. 5. If the data output optical fibers 48 are run diagonally, $2\sqrt{N}-1$ optical fibers 52 can be accommodated at the price of more complex and unevenly distributed conflict resolution scheme as shown in FIG. 8.

While the above embodiments have assumed a single bit memory signal, in fact, memory signals can contain an entire word of W bits, stored electronically and returned in parallel on, in general, W optical data output optical fibers 48. Since the above-described technique for resolving data contention requires only certain optical transducers 18 to be read, there must be some way the processor is made aware of which of its requests are being answered. One way this can be accomplished is tagging each memory signal with its column 32 number. Then each processor may read the column 32 address along with the data of the memory signal and use the data only if the address coincides with its request. If not, the processor must re-issue the memory signal request. For a memory of size N, $\log(\sqrt{N})$ tag bits are needed, which increases the number of bits stored in each memory location from W to $W + \log(\sqrt{N})$.

Figure 8:
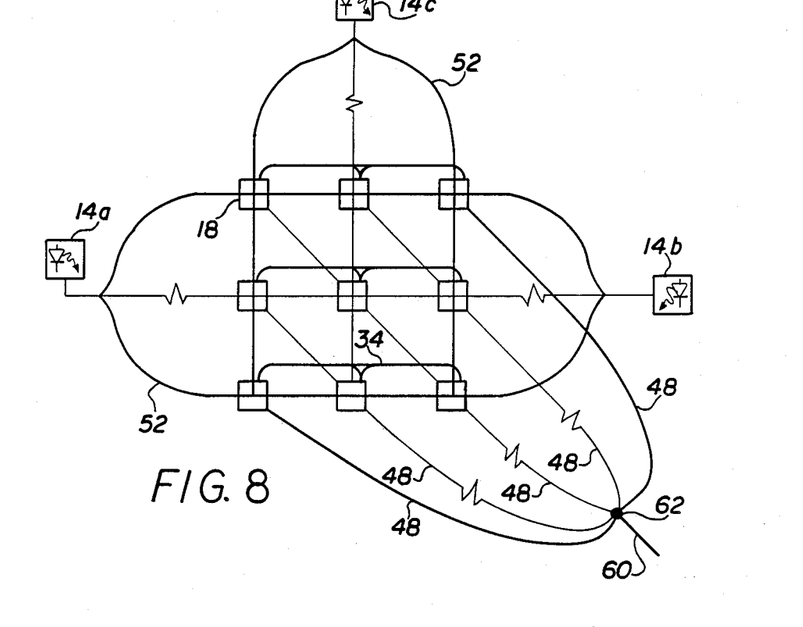
FIG. 8 is a schematic representation of an alternative embodiment of 2-dimensional optical selector switch.

An embodiment of an optical selector switch used as a memory module which has write capabilities utilizes, for instance, 2 N row 30×N column 32 of optical transducer 18 arrays 26 but with only one memory 44 associated with 2 associated optical transducers 18 as shown in FIG. 8. The two associated optical transducers 18 allow control to be had as to whether reading of or writing to the memory 44 occurs. For example, by using 2 associated optical transducers 18 of 2 operational arrays 26a, 26b, then 4 states are attainable which control the memory. The four states are identified as (0,0) (0,1), (1,0) and (1,1). A 0 occurs when there is no convergence of dark pulses at the optical transducer 18 in question of the array 26a or 26b. A 1 occurs when there is convergence of dark pulses at the optical transducer 18 in question of the array 26a or 26b.

When dark pulses do not converge at either of the two associated optical transducers in question causing a (0,0) to occur, (0,0) can be understood to mean that a 0 is to be written into the memory. If convergence of dark pulses occurs at the optical transducer 18 of the second array 26b, but not at the associated optical transducer 18 of the first array 26a, then a (0,1) occurs and this can be understood to mean a 1 is written into the memory. Thus a convention can be selected where the first number determines whether a read can occur (if a 1 occurs) or a write can occur (if a 0 occurs) and the second number determines whether the read is carried out (if the first number is a 1 and the second number is a 0) or what number is to be written into memory (if the first number is a zero and the second number is a 0 or 1, then a 0 or 1 is written, respectively, into the memory). If a 1,1 occurs then it can be understood to mean that nothing is done.

If the memory 44 is L-bits in length and not 1 bit in length then the L bits can be written in serial by having the already stored bits moved, for instance, 1 location over (left or right) in the memory 44, so room is made for the new bit being written into the memory 44. After L-bits are written into the memory 44 a (1,0) can occur causing the memory 44 to be read as described above. FIG. 8 is a schematic representation of only the 2 arrays 26a, 26b and the laser diodes 14a, 14b, 14c but does not include the priority chain optical fibers 34, etc., for simplicity of understanding.

In another embodiment of an optical selector switch 10 used as a memory module which has write capabilities, there are L+1 arrays 26, with L+1 associated optical transducers 18 with an associated memory being L bits in length, as shown in FIG. 9 which shows a portion of the L+1 arrays comprising the L+1 associated optical transducer 18 and the memory 44. This embodiment is useful when it is desired to write at the same time (in parallel, rather than in serial, as in the previous embodiment), the L bits into the L bit length memory 44. As in the previous write embodiment, a 0 in the read array causes whatever the value in a specific optical transducer 18 of the L+1 associated optical transducers to be written into the corresponding bit location of the memory 44. In general, a L-bit in length memory requires L+1 arrays 26 of optical transducers 18.

Although the invention has been described in detail for the purposes of illustration, it is to be understood that such detail is solely for that purpose and that variations can be made therein by those skilled in the art without departing from the spirit and scope of the invention except as it may be limited by the claims.

We claim:

1. An optical selector switch comprising:
   an optical waveguide means;
   M means for producing light that can be transmitted through the optical waveguide means, said M light producing means optically connected to the optical waveguide means, M being greater than or equal to 2;

means for controlling when each of the M light producing means produces optical pulses to be transmitted through the optical waveguide means; and N optical transducers optically connected to the optical waveguide means and arranged in a three dimensional array, each of N optical transducers capable of producing an electrical signal corresponding to the combination of optical pulses received from the M light producing means, N being greater than or equal to 2.

2. A switch as described in claim 1 wherein the N optical transducers are disposed in serial along the optical waveguide means forming a linear array, with each of the N optical transducers situated at a predetermined position from each of the M light producing means.

3. A switch as described in claim 1 wherein the N optical transducers are arranged in a 2-dimensional array.

4. A switch as described in claim 3 where the N optical transducers are arranged in a $\sqrt{N}$ rows$\times\sqrt{N}$ columns array.

5. A switch as described in claim 4 wherein M=3 and wherein there is a first, second and third light producing means; and wherein each of the N optical transducers are a distance d apart, where $d = \tau Cg$ and where $\tau$ is the band-width of the pulse and $Cg$ is the speed of the light in the optical waveguide means produced from the first, second and third light producing means; and the first and second light producing means are optically connected to the optical waveguide means such that the optical pulses from the first light producing means and the optical pulses from the second light producing means are transmitted in opposite directions through the optical waveguide means along the $\sqrt{N}$ rows, and the third light producing means is optically connected to the optical waveguide means such that the optical pulses from the third light producing means are transmitted through the optical waveguide means along the $\sqrt{N}$ columns.

6. A switch as described in claim 5 wherein an optical pulse from the first light producing means is transmitted along each of the $\sqrt{N}$ rows and is received by the $\sqrt{N}$ transducers of any given column at essentially the same time, an optical pulse from the second light producing means is transmitted along each of the $\sqrt{N}$ rows and is received by the $\sqrt{N}$ optical transducers of any given column at essentially the same time, and an optical pulse from the third light producing means is transmitted along each of the $\sqrt{N}$ columns and is received by the $\sqrt{N}$ optical transducers of any given row at essentially the same time.

7. A switch as described in claim 6 wherein an optical transducer produces an electrical signal when a wavefront of a light pulse from each of the first, second and third light producing means is received at essentially the same time by the optical transducer.

8. A switch as described in claim 6 wherein an optical transducer produces an electrical signal when a wavefront of a dark pulse from each of the first, second and third light producing means is received at essentially the same time by the optical transducer.

9. A switch as described in claim 8 wherein the optical transducer includes an optical OR gate which produces an electrical signal corresponding to logic zero when the wavefront of a dark pulse from each of the first, second and third light producing means is received at essentially the same time by the optical transducer.

10. A switch as described in claim 9 wherein the optical OR gate includes a photodetector optically connected to the optical waveguide means.

11. A switch as described in claim 10 including $\sqrt{N}$ priority chain optical fibers for transmitting light, each one of said $\sqrt{N}$ priority chain optical fibers being optically connected to each of the $\sqrt{N}$ optical transducers in each one of the $\sqrt{N}$ rows, respectively; a synchronation signal line for transmitting a synchronation signal which is electrically connected to each of the $\sqrt{N}$ optical transducers; and wherein an optical transducer includes a NOR gate electrically connected to the photodetector, a chain receive photodetector optically connected to the respective priority chain optical fiber which receives light therefrom and producing chain receive electrical signal, said chain receive photodetector electrically connected to the NOR gate such that when the chain receive electrical signal is produced it is received by the NOR gate; a chain send laser diode electrically connected to the photodetector and optically connected to the respective priority chain optical fiber such that when an electrical signal is produced by the photodetector the chain send laser diode produces light that is transmitted through the priority chain optical fiber, a memory having a memory signal electrically connected to the NOR gate; and a data output laser diode electrically connected to the NOR gate and the synchronation signal line, such that the data output laser diode produces a signal corresponding to the signal produced by the NOR gate when it receives a synchronation signal.

12. A switch as described in claim 11 including $\sqrt{N}$ data output optical fibers optically connected to the data output laser diode of the $\sqrt{N}$ optical transducers in the $\sqrt{N}$ columns, respectively.

13. A switch as described in claim 12 wherein the optical transducer includes a select latch electrically connected to the photodetector and which produces the electrical signal corresponding thereto, said select latch also electrically connected to the NOR gate and the priority chain laser diode and providing a signal thereto.

14. A switch as described in claim 13 wherein the optical waveguide means includes 2 $\sqrt{N}$ optical fibers, 1 through $\sqrt{N}$ the 2 $\sqrt{N}$ optical fibers being optically connected to the photodetector of each of the N optical transducers of the $\sqrt{N}$ rows, respectively, and also optically connected to the first and second laser diodes; and $\sqrt{N}+1$ through 2 $\sqrt{N}$ of the 2 $\sqrt{N}$ optical fibers being optically connected to the photodetectors of each of the $\sqrt{N}$ optical transducers of the columns, and also optically connected to the third laser diode.

15. A switch as described in claim 14 including a data collection optical fiber optically connected at a common merge point to each of the $\sqrt{N}$ data output optical fibers.

16. A switch as described in claim 11 wherein the $\sqrt{N}$ rows x $\sqrt{N}$ columns array has 2 $\sqrt{+1}$ diagonals of optical transducers, and including 2 $\sqrt{N}-1$ data collection optical fibers optically connected to the data output laser diodes of each optical transducer in the 2 $\sqrt{N}-1$ diagonals, respectively.

17. A switch as described in claim 1 including N/2 memories and wherein the N optical transducers 18 are arranged in a first and second $\sqrt{N/2}$ rows x $\sqrt{N/2}$ columns array, said first and second arrays aligned such that each optical transducer in the first array is electrically connected to 1 memory of the N/2 memories and has an associated optical transducer in the second array also connected to the respective 1 memory of the N/2 memories, said memory having a memory signal corresponding to the electrical signals received from the optical transducers to which it is electrically connected.

18. A switch as described in claim 1 including $$\sqrt{\frac{N}{L+1}}$$

memories; and wherein the N optical transducers are arranged in $$L+1\sqrt{\frac{N}{L+1}} \text{ rows} \times \sqrt{\frac{N}{L+1}} \text{ columns}$$

arrays each memory is electrically connected to one of the $$\sqrt{\frac{N}{L+1}}$$

optical transducers in each array, each memory having a memory signal corresponding to the electrical signals received from the optical transducers to which it is electrically connected.

19. An optical selector switch comprising:
2 N optical transducers arranged in a first and second $\sqrt{N}$ rows x $\sqrt{N}$ columns array, each optical transducer including an OR gate having a photodetector, each array including first, second and third laser diodes, and 2 $\sqrt{N}$ optical fibers, 1 through $\sqrt{N}$ of the 2 $\sqrt{N}$ optical fibers being connected to the photodetector of each of the $\sqrt{N}$ transducers of the $\sqrt{N}$ rows, respectively, and also optically connected to the first and second laser diodes such that the optical pulses from the first laser diode and the optical pulses from the second laser diode are transmitted in opposite directions through the $\sqrt{N}$ optical fibers along the $\sqrt{N}$ rows, and an optical pulse from the first laser diode is transmitted along each of $\sqrt{N}$ rows and is received by the $\sqrt{N}$ optical transducers of any given column at essentially the same time, and an optical pulse from the second laser diode is transmitted along each of the $\sqrt{N}$ rows and is received by the $\sqrt{N}$ optical transducers of any given column at essentially the same time, and $\sqrt{N+1}$ through 2 $\sqrt{N}$ the 2 $\sqrt{N}$ optical fibers being optically connected to the photodetectors of each of $\sqrt{N}$ optical transducers of the $\sqrt{N}$ columns, and also optically connected to the third laser diode such that the optical pulses from the third laser diode are transmitted through the $\sqrt{N}$ optical fibers along the $\sqrt{N}$ columns, and an optical pulse from the third laser diode is transmitted along each of the $\sqrt{N}$ columns and is received by the $\sqrt{N}$ optical transducers of any given row at essentially the same time, each of the N optical transducers are a distance $\kappa d$ apart, where $d=\tau Cg$ and where $\tau$ is the duty cycle of the pulse and Cg is the speed of the light in the optical fiber produced from the first, second and third laser diodes and $\kappa \geq 1$, and each photodetector of an optical transducer produces an electrical signal corresponding to logic zero when a wavefront of a dark pulse from each of the first, second and third laser diodes is received at essentially the same time by the photodetector of an optical transducer;

a timing circuit for controlling when the first, second and third laser diodes produce optical pulses to be transmitted through the 2 $\sqrt{N}$ fibers in the respective arrays;

N memories, said first and second arrays aligned such that each optical transducer in the first array is electrically connected to 1 memory of the N memories and has an associated optical transducer in the second array also connected to the respective 1 memory of the N memories, said memory having a memory signal corresponding to the electrical signals received from the optical transducers to which it is electrically connected;

a synchronation signal line for transmitting a synchronation signal;

N data output laser diodes electrically connected to the synchronation signal line, each data output laser diode also electrically connected to 1 of the N memories and producing an optical signal corresponding to the memory signal of the memory to which it is electrically connected when the synchronation signal from the synchronation signal line is received; and N data output optical fibers, each data output optical fiber optically connected to 1 of the data output laser diodes and transmitting the optical signal produced by the data output laser diode to which it is optically connected.

20. An optical selector switch comprising:
an optical waveguide means;
first and second light means for producing light that can be transmitted through the optical waveguide means, said first and second light producing means optically connected to the optical waveguide means such that the optical pulses from the first light producing means and the optical pulses from the second light producing means are transmitted in opposite directions through the optical waveguide means;

means for controlling when each of the first and second light producing means produces optical pulses to be transmitted through the optical waveguide means; and N optical transducers optically connected to the optical waveguide means in serial along the optical waveguide means forming a linear array, with each of the N optical transducers situated at a distance $\kappa d$ apart, where $d = \tau Cg$ and where $\tau$ is the duty cycle of the pulses and Cg is the speed of the light produced from the first and second light producing means in the optical waveguide means and wherein $\kappa \geq 1$, each of N optical transducers capable of producing an electrical signal corresponding to the combination of optical pulses received from the first and second light producing means, N being greater than or equal to 2.

21. A switch as described in claim 20 wherein an optical transducer produces an electrical signal when a wavefront of a light pulse from the first and second light producing means is received at essentially the same time by the optical transducer.

22. A switch as described in claim 20 wherein an optical transducer produces an electrical signal when a wavefront of a dark pulse from the first and second light producing means is received at essentially the same time by the optical transducer.

23. A switch as described in claim 22 wherein the optical transducer includes an optical OR gate which produces an electrical signal corresponding to logic zero when the wavefront of a dark pulse from the first and second light producing means is received at essentially the same time by the optical transducer.

24. A switch as described in claim 23 wherein the first and second light producing means are first and second laser diodes.

25. A switch as described in claim 24 wherein the optical waveguide means includes an optical fiber optically connected to the first and second laser diodes and to the N optical transducers.

26. A switch as described in claim 25 wherein the optical OR gate includes a photodetector that is optically connected to the optical fiber.

27. A switch as described in claim 26 including N memory cells for storing a memory signal and disposed such that each one of the N memory cells is electrically connected to each one of the N photodetectors of the N optical transducers and receives the electrical signal therefrom, each of said N memory cells producing its memory signal when an electrical signal is received from the with which it is electrically connected.

28. A switch as described in claim 27 including a synchronation signal line for transmitting a synchronation signal and N data laser diodes disposed such that each one of the N data laser diodes is electrically connected to the synchronation signal line and to each one of the N memory cells in order to receive the memory signal therefrom, each of said N data laser diodes producing an optical signal corresponding to the synchronation signal and the memory signal it receives from the synchronation signal line and the photodetector, respectively.

29. A switch as described in claim 28 wherein each of the N data laser diodes produce their respective optical signal at essentially the same time.

30. A switch as described in claim 29 including a data output optical fiber optically connected to each of the N data laser diodes, each of said data laser diodes being a distance d apart and being essentially the same optical distance from the data output optical fiber.

31. An optical selector switch comprising:
an optical waveguide means;
first and second light means for producing light that can be transmitted through the optical waveguide means, said first and second light producing means optically connected to the optical waveguide means such that the optical pulses from the first light producing means and the optical pulses from the second light producing means are transmitted in the same direction through the optical waveguide means.
means for controlling when each of the first and second light producing means produces optical pulses to be transmitted through the optical waveguide means; and
N optical transducers optically connected to the optical waveguide means in serial along the optical waveguide means forming a linear array, with each of the N optical transducers situated at a distance $\kappa d$ apart, where $d = \tau Cg$ and where $\tau$ is the duty cycle of the pulse and $Cg$ is the speed of the light produced from the first and second light producing means in the optical waveguide means and wherein $\kappa \geq 1$, each of N optical transducers capable of producing an electrical signal corresponding to the combination of optical pulses received from the first and second light producing means, N being greater than or equal to 2.

* * * * *

UNITED STATES PATENT AND TRADEMARK OFFICE
CERTIFICATE OF CORRECTION

PATENT NO. : 4,883,334
DATED : November 28, 1989
INVENTOR(S) : Donald M. Chiarulli, et al.

It is certified that error appears in the above—identified patent and that said Letters Patent is hereby corrected as shown below:

In the Abstract, at line 11, the word "transduces" should be replaced by the word -- transducers -- .

At column 4, line 59, the word "memorY" should be -- memory -- .

At column 6, line 10, the term "$\kappa \leq 1$" should be -- $\kappa \geq 1$ -- .

At column 6, line 61, the comma between the word "the" and the term "$\sqrt{N}$" should be deleted.

At column 6, line 64, the term "respectively," should be -- respectively. -- .

At column 6, lines 64-65, the two occurrences of the word "synchronation" should each be -- synchronization -- .

At column 7, line 38, the word -- optical -- should be inserted after the term "$2\sqrt{N}$".

At column 8, line 52, the number "146" should be -- 14c -- .

At column 8, line 56, the word "Wavefront" should be -- wavefront -- .

At column 9, line 20, the formula "$t_{ref} - t_{row} = (-i)\tau$" should be -- $t_{ref} - t_{row} = (j-i)\tau$ -- .

UNITED STATES PATENT AND TRADEMARK OFFICE
CERTIFICATE OF CORRECTION

PATENT NO. : 4,883,334
DATED : November 28, 1989
INVENTOR(S) : Donald M. Chiarulli, et al.

It is certified that error appears in the above—identified patent and that said Letters Patent is hereby corrected as shown below:

At column 10, line 7, the term -- i -- should be inserted before the word "and".

At column 10, line 11, the term "$(\sqrt{N-i+1})^{th}$" should be -- $(\sqrt{N-i+1})th$ -- .

At column 10, line 42, after the word "The", insert the phrase -- local select signal is also used to turn on a chain send -- .

At column 10, line 50, the term "$\sqrt{}N$" should be -- $\sqrt{N}$ -- .

At column 10, line 60, the phrase "2-diomensional" should be -- 2-dimensional -- .

At column 10, line 62, the term "$2\sqrt{N}\ \tau$" should be -- $2\sqrt{N}\ \tau$ -- .

At column 11, line 17, the formula "tpd + td+tg," should be -- $t_{pd} + t_d+t_g,$ -- .

At column 11, line 29, the term "$\sqrt{N}\ \tau$" should be -- $\sqrt{N}\ \tau$ -- .

At column 11, line 36, the term "$6\sqrt{\tau}$" should be -- $6\sqrt{N}\ \tau$ -- .

At column 11, line 41, the word -- by -- should be inserted before the word "rearranging".

UNITED STATES PATENT AND TRADEMARK OFFICE
CERTIFICATE OF CORRECTION

PATENT NO. : 4,883,334

DATED : November 28, 1989

INVENTOR(S) : Donald M. Chiarulli, et al.

It is certified that error appears in the above—identified patent and that said Letters Patent is hereby corrected as shown below:

In Claim 6, at column 13, line 46, the word -- optical -- should be inserted before the word "transducers".

In Claim 11, at column 14, lines 10-11, 30 and 32-33, the four occurrences of the word "synchronation" should each be -- synchronization -- .

In Claim 19, at column 15, line 36, the word -- optically -- should be inserted between the words "being" and "connected".

In Claim 19, at column 15, line 51, the term "$2\sqrt{N}$" should be the phrase -- $2\sqrt{N}$ of -- .

In Claim 19, at column 15, line 53, the term "$\sqrt{N}$" should be the phrase -- the $\sqrt{N}$ -- .

In Claim 19, at column 16, line 6, the word -- optical -- should be inserted before the word "fibers".

In Claim 19, at column 16, lines 17, 20 and 26, the three occurrences of the word "synchronation" should each be -- synchronization -- .

UNITED STATES PATENT AND TRADEMARK OFFICE
CERTIFICATE OF CORRECTION

PATENT NO. : 4,883,334

DATED : November 28, 1989

INVENTOR(S) : Donald M. Chiarulli, et al.

It is certified that error appears in the above—identified patent and that said Letters Patent is hereby corrected as shown below:

In Claim 19, at column 16, line 29, the phrase "the data" should be -- the N data -- .

In Claim 27, at column 17, line 26, insert the word -- memory -- between the words "the" and "with."

Signed and Sealed this

Twenty-third Day of October, 1990

Attest:

HARRY F. MANBECK, JR.

Attesting Officer      Commissioner of Patents and Trademarks